(12) United States Patent
Lach et al.

(10) Patent No.: US 9,147,593 B2
(45) Date of Patent: Sep. 29, 2015

(54) APPARATUS FOR LIQUID TREATMENT OF WAFER SHAPED ARTICLES

(71) Applicant: LAM RESEARCH AG, Villach (AT)

(72) Inventors: Otto Lach, Treffen (AT); Stephan Hoffmann, Finkenstein (AT)

(73) Assignee: LAM RESEARCH AG, Villach (AT)

( * ) Notice: Subject to any disclaimer, the term of this patent is extended or adjusted under 35 U.S.C. 154(b) by 534 days.

(21) Appl. No.: 13/648,916

(22) Filed: Oct. 10, 2012

(65) Prior Publication Data

US 2014/0097580 A1 Apr. 10, 2014

(51) Int. Cl.
*H01L 21/687* (2006.01)
*H01L 21/67* (2006.01)

(52) U.S. Cl.
CPC .... *H01L 21/68728* (2013.01); *H01L 21/67051* (2013.01); *Y10T 279/1986* (2015.01); *Y10T 279/3493* (2015.01)

(58) Field of Classification Search
CPC ............. H01L 21/6838; H01L 21/68792; H01L 21/68728; H01L 21/68785; Y10T 279/20
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,435,200 B1 * | 8/2002 | Langen | 134/99.1 |
| 6,536,454 B2 | 3/2003 | Lindner | |
| 7,172,674 B2 * | 2/2007 | Engesser | 156/345.19 |
| 7,335,090 B2 * | 2/2008 | Takahashi | 451/41 |
| 7,819,985 B2 * | 10/2010 | Verhaverbeke et al. | 134/33 |
| 7,837,803 B2 | 11/2010 | Hohenwarter | |
| 7,891,314 B2 | 2/2011 | Pichler | |
| 2002/0002991 A1 * | 1/2002 | Lindner | 134/153 |
| 2003/0092264 A1 * | 5/2003 | Kajita et al. | 438/689 |
| 2003/0165043 A1 * | 9/2003 | Logan et al. | 361/234 |
| 2008/0110861 A1 * | 5/2008 | Kajita et al. | 216/83 |
| 2010/0200163 A1 * | 8/2010 | Puggi et al. | 156/345.21 |
| 2011/0254236 A1 | 10/2011 | Brugger et al. | |

FOREIGN PATENT DOCUMENTS

| | | |
|---|---|---|
| WO | 2004/084278 | 9/2004 |
| WO | 2006/008236 | 1/2006 |

* cited by examiner

*Primary Examiner* — Lee D Wilson
*Assistant Examiner* — Tyrone V Hall, Jr.
(74) *Attorney, Agent, or Firm* — Young & Thompson

(57) ABSTRACT

Apparatus for processing wafer-shaped articles comprises a chuck adapted to hold a wafer-shaped article of a predetermined diameter during a processing operation to be performed on the wafer-shaped article. The chuck comprises a chuck body having an outer surface that faces a wafer-shaped article when positioned on the chuck. The outer surface comprises a first electrically conductive material and the chuck body further comprises a first conductive pathway between the first conductive material and ground.

15 Claims, 2 Drawing Sheets

APPARATUS FOR LIQUID TREATMENT OF WAFER SHAPED ARTICLES

BACKGROUND OF THE INVENTION

1. Field of the Invention

The invention relates to an apparatus for liquid treatment of wafer-shaped articles.

2. Description of Related Art

Semiconductor wafers undergo a variety of wet processing stages during manufacture of integrated circuits. To accommodate such processes, a single wafer may be supported in relation to one or more treatment fluid nozzles by a chuck associated with a rotatable or non-rotatable carrier. Wafer-supporting chucks are described for example in U.S. Pat. Nos. 4,903,717, 5,513,668, 6,435,200 and 6,536,454.

It is known that semiconductor wafer processing can result in unwanted buildup of static charge on the wafer surface. For example, U.S. Pat. No. 7,335,090 describes a spin chuck having holding pins which are formed of conductive resin and associated with a stainless steel shaft, which in turn is supported by radial metal bearings. Commonly-owned co-pending application U.S. Pub. No. 2011/0254236 describes a chuck with conductive chuck pins as well as a conductive path to connect the chuck pins with the shaft of the chuck drive and elevating unit.

While providing a conductive path in contact with the wafer edge via the griping pins was assumed to solve the problem of unwanted wafer charging, the present inventors have discovered unexpectedly that charging of a wafer may occur even in the absence of physical contact between the wafer and the chuck, as may occur at various stages during wafer processing.

SUMMARY OF THE INVENTION

Thus, in one aspect, the present invention relates to an apparatus for processing wafer-shaped articles, comprising a chuck adapted to hold a wafer-shaped article of a predetermined diameter during a processing operation to be performed on the wafer-shaped article. The chuck comprises a chuck body having an outer surface that faces a wafer-shaped article when positioned on the chuck. The outer surface comprises a first electrically conductive material and the chuck body further comprises a first conductive pathway for grounding the first conductive material.

In preferred embodiments of the apparatus according to the invention, the chuck body comprises a chuck base body and a cover fitted to the chuck base body, and the cover comprises said first electrically conductive material.

In preferred embodiments of the apparatus according to the invention, the chuck includes a plurality of pin assemblies adapted and positioned relative to the chuck body so as to support a wafer-shaped article to be processed. At least one of the pin assemblies comprises a second electrically conductive material.

In preferred embodiments of the apparatus according to the invention, the chuck is a spin chuck surrounded by a process chamber for single wafer wet processing of semiconductor wafers.

In preferred embodiments of the apparatus according to the invention, the first conductive pathway comprises at least one conductive helical spring contacting at one end a conductive element mounted on the cover and contacting at another end a conductive element mounted on the chuck base body.

In preferred embodiments of the apparatus according to the invention, the first conductive pathway comprises at least one conductive strip mounted on the chuck base body and extending from a peripheral region to a central region of the chuck base body.

In preferred embodiments of the apparatus according to the invention, the chuck is adapted to hold a wafer-shaped article such that the wafer-shaped article does not contact the outer surface of said chuck body.

In preferred embodiments of the apparatus according to the invention, a second conductive pathway extends from the at least one of the pin assemblies to ground.

In preferred embodiments of the apparatus according to the invention, the conductive pathway leads to a frame on which the chuck is mounted.

In preferred embodiments of the apparatus according to the invention, the chuck includes a plurality of pin assemblies adapted and positioned relative to the chuck body so as to support a wafer-shaped article to be processed, and a ring gear in meshing engagement with each of the plurality of pin assemblies.

In preferred embodiments of the apparatus according to the invention, the first conductive pathway comprises a first annular conductive element mounted on an interior surface of the cover, a second annular conductive element mounted on an interior surface of the chuck base body, and a plurality of conductive helical springs, each of the plurality of conductive helical springs having a first end contacting the first annular conductive element and a second end contacting the second annular conductive element.

In preferred embodiments of the apparatus according to the invention, the second conductive pathway comprises an electrically conductive needle bearing contacting the at least one of the pin assemblies.

In preferred embodiments of the apparatus according to the invention, the cover is joined to the chuck base body so as to form an internal gap therebetween, the first conductive pathway being provided within the internal gap.

In preferred embodiments of the apparatus according to the invention, a stationary nozzle assembly protrudes through a central portion of the chuck body, the stationary nozzle assembly being adapted to supply one or more treatment fluids to an underside of a wafer-shaped article when positioned on the chuck.

In preferred embodiments of the apparatus according to the invention, each of the plurality of pin assemblies comprises a gripping pin positioned eccentrically to a pivotal axis of its respective pin assembly, whereby rotation of the ring gear causes each of the gripping pins to move simultaneously either toward or away from an axis of rotation of the chuck.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
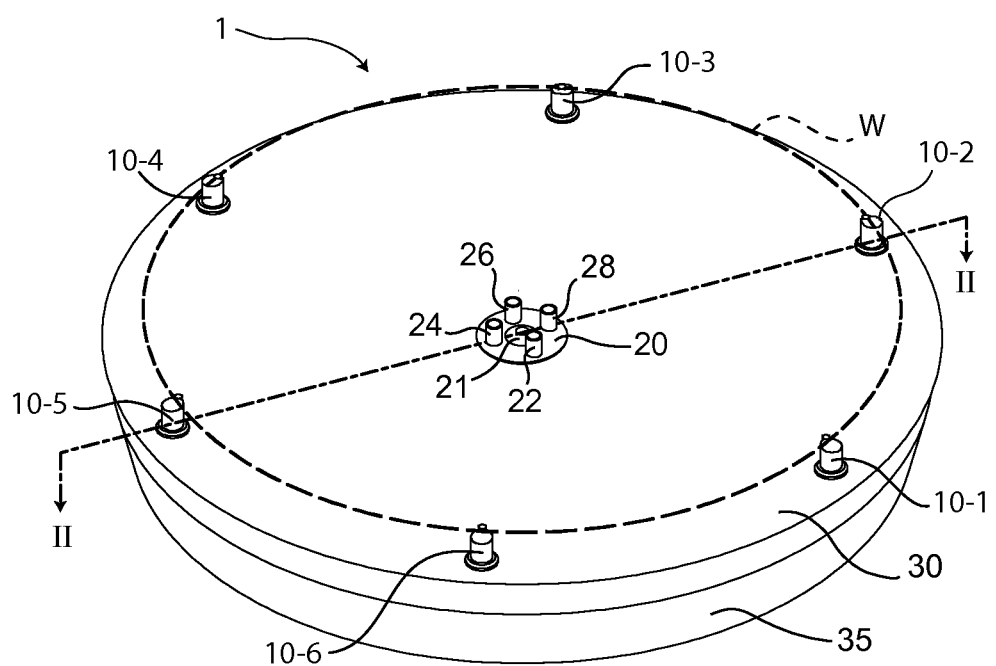
FIG. 1 is a schematic perspective view from above of a chuck according to an embodiment of the invention, with a wafer in position as indicated in broken line.

Referring now to the drawings, FIG. 1 depicts a spin chuck 1 that holds a wafer W thereon in a predetermined orientation, which is preferably such that the major surfaces of the wafer W are disposed horizontally or within ±20° of horizontal. Spin chuck 1 may for example be a chuck that operates according to the Bernoulli principle, as described for example in U.S. Pat. No. 4,903,717.

Chuck 1 includes a series of gripping pins, which in this embodiment are six in number, designated 10-1 through 10-6. Gripping pins 10-1 to 10-6 prevent the wafer from sliding laterally off the chuck. In this embodiment, the upper portions of gripping pins 10-1 to 10-6 also provide subjacent support for wafer W, and thus the chuck need not operate according to the Bernoulli principle and need not be adapted to supply a gas cushion beneath wafer. In particular, each gripping pin comprises an uppermost gripping portion that extends vertically from the cylindrical pin base, generally along an axis that is offset in relation to the rotation axis of the cylindrical pin base. The upper gripping portions furthermore each comprise a lateral recess or cut-out that is designed to accommodate the peripheral edge of a wafer, as is described in greater detail below.

Gripping pins 10-1 to 10-6 project upwardly through holes formed in a chuck cover 30, which is mounted to the base body 35 of the chuck 1.

Gripping elements 10-1 to 10-6 are provided with eccentrically mounted grippers. The gripping elements are conjointly rotated about their cylindrical axes by a ring gear 16 that rotates coaxially with chuck 1 and is simultaneously in meshing engaging with all of the gripping elements. The eccentric grippers are thus moved in concert between a radially inner closed position in which a wafer W is secured, to a radially outer open position in which the wafer W is released. Gripping elements 10-1 to 10-6 comprise an eccentric uppermost portion that contacts wafer W, projecting from a base that is mounted for pivotal movement about its central axis. In particular, the ring gear 16 is centered on the underside of the chuck upper body, and simultaneously engages via its peripheral gear teeth with gear teeth formed on the base of each of the pins 10-1 to 10-6. Pins 10-1 to 10-6 are evenly distributed about the periphery of spin chuck 1, with at least three and preferably six such pins 10 being provided.

Although not shown in the figures, the spin chuck may be surrounded by a process chamber, which may be a multi-level process chamber as described in commonly-owned U.S. Pat. No. 7,837,803 (corresponding to WO 2004/084278). The spin chuck can be positioned at the selected level by moving the chuck axially relative to the stationary surrounding chamber or by moving the surrounding chamber axially relative to the axially-stationary chuck, as described in connection with FIG. 4 of U.S. Pat. No. 6,536,454.

Figure 2:
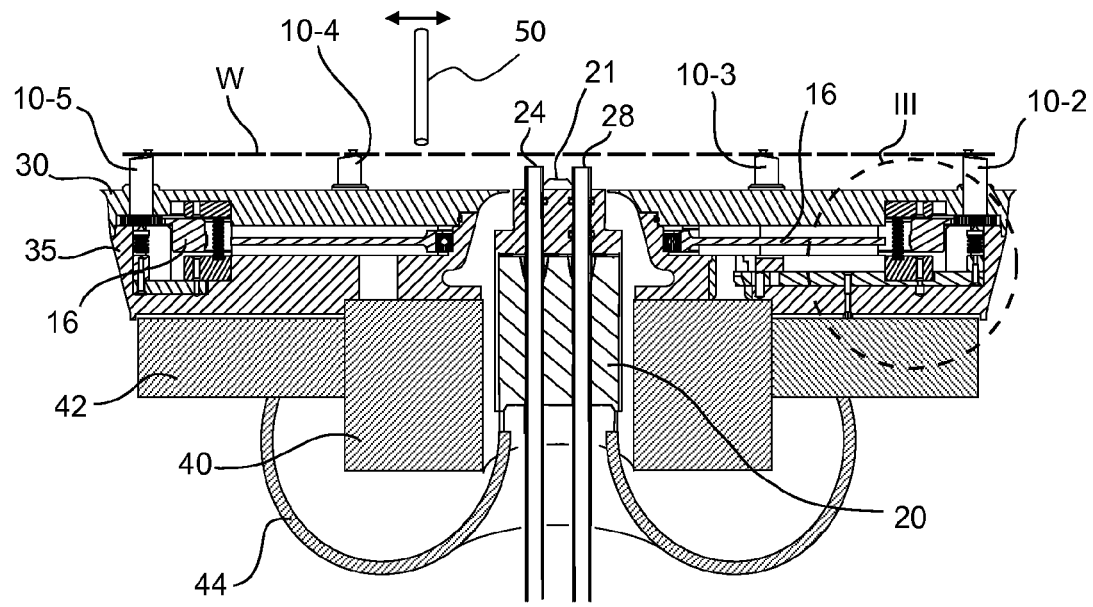
FIG. 2 is a partial axial section through the chuck depicted in FIG. 1, taken along the line II-II of FIG. 1.

As shown in greater detail in FIG. 2, the dispensing assembly comprises a non-rotating (stationary) nozzle head 20 whose nozzles penetrate the cover of the heating assembly, as described below. In this embodiment, five nozzles 21, 22, 24, 26, 28 protrude through the nozzle head. Pipes feeding these nozzles are each connected to different fluid sources. For example, nozzle 22 might supply deionized water, central nozzle 21 might supply dry nitrogen gas, and nozzles 24, 26 and 28 might supply respectively different process liquids. The nozzles 21, 22, 24, 26, 28 are directed towards the downwardly facing surface of the wafer W.

Spin chuck 1 is mounted to the rotor of a hollow-shaft motor 40 (schematically shown in FIG. 2), and the stationary nozzle head 20 penetrates through a central opening of the spin chuck 1. The stator of the hollow-shaft motor 40 is mounted to the mounting plate 42 (schematically shown in FIG. 2). Nozzle head 20 and mounting plate 42 are mounted to the same stationary frame 44 (schematically shown in FIG. 2).

An upper liquid dispenser 50 supplies treatment liquid from above, and can incorporate a plurality of different liquid dispensing nozzles for dispensing a variety of different treatment liquids, as described for example in commonly-owned U.S. Pat. No. 7,891,314 (corresponding to WO 2006/008236). Upper liquid dispenser 50 is preferably displaceable radially of the wafer W, to aid in spreading treatment liquid over the entire upwardly facing surface of wafer W as it is rotated on the spin chuck.

A given chuck 1 is designed for holding a wafer of a particular diameter. The gripping surfaces of pins 10-1 to 10-6, when in their radially inner closed position, thus describe a circle of that diameter. Chucks for wafers currently in commercial production are designed to hold wafers of 200 mm or 300 mm, while wafers of 450 mm will be the next generation.

Figure 3:
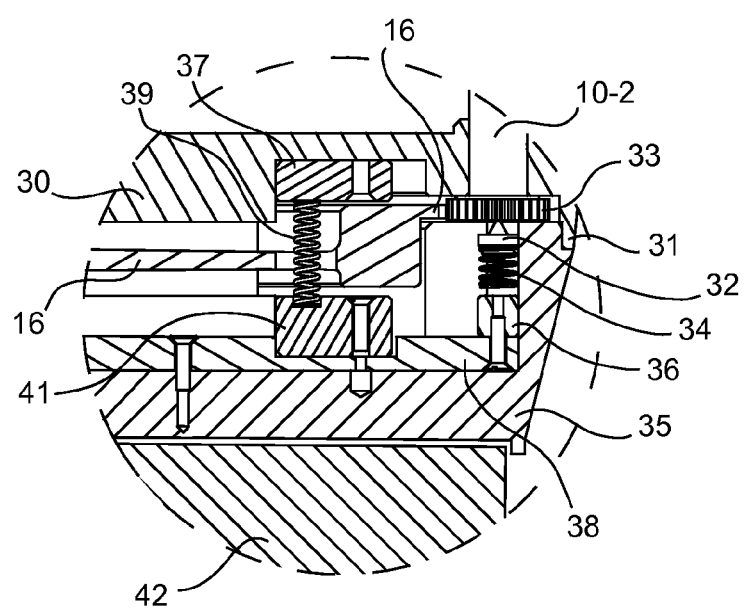
FIG. 3 is an enlarged view of the detail III designated in FIG. 2.

As shown in FIG. 3, the cover 30 of chuck 1 is seated via an annular rib 31 at its outer periphery on the outer rim of the chuck base body 35 such that an internal gap is provided between an upper surface of the base body 35 and a lower surface of the cover 30.

The internal gap in this embodiment accommodates the ring gear 16 and additional components to be described in greater detail below. In the case where the chuck is embodied as a Bernoulli chuck, this internal gap can in additional serve as a gas distribution chamber feeding an array of openings provided in the cover 30, as is described in commonly-owned co-pending application U.S. Pub. No. 2011/0254236.

As shown in FIG. 3, the ring gear 16 meshes via its radially outwardly extending peripheral teeth with a gear wheel 33 of each of the pin assemblies 10-1 through 10-6. Each pin assembly 10-1 through 10-6 further includes a shaft extending from the gear wheel 33, which shaft is received rotatably in bores in the cover 30 and which carries a gripping pin as described above arranged eccentrically to the axis of rotation of the shaft. Each pin assembly 10-1 through 10-6 is urged upwardly toward cover 30 by a needle bearing 32 and associated helical spring 34, each of which is located within a recess formed within the outer upwardly extending peripheral edge of base body 35.

By turning the shafts of the pin assemblies 10-1 through 10-6 with the aid of the ring gear 16, the radial distance of the gripping pins from the axis of rotation of the chuck 1 can be varied. Mechanisms for providing relative movement of a ring gear and a chuck body so as to rotate eccentrically located pins are known as described for example in U.S. Pat. Nos. 4,903,717 and 5,513,668.

It is known to form chuck components, such as wafer-supporting pins, from material that is relatively inert to highly corrosive chemicals that are sometimes used in wafer processing. Such materials include polyvinylidene fluoride (PVDF), polyetheretherketone (PEEK) and polytetrafluoroethylene (PTFE), among others. As noted, these non-conductive materials can result in an unwanted buildup of static charge, leading to risk of accumulation of contaminants or damage to electronic elements of an integrated circuit on the wafer due to electrostatic discharge.

In accordance with the device described in commonly-owned co-pending application U.S. Pub. No. 2011/0254236, one or more of the pin assemblies were formed from static dissipative or electrically conductive material, such as conductive plastic, so as to dissipate static charge through the conductive pin assemblies and along the conductive path established within the chuck.

The present inventors have discovered, however, that significant static charges may still be developed on the surfaces of the wafer undergoing treatment. In particular, the present inventors have recognized that the cover of the chuck body, being conventionally formed of an insulating material, can cause such a static charge buildup despite that the cover and the wafer do not come into contact and despite the provision of a conductive path from the wafer to and through the gripping pins.

Specifically, during testing of devices as described in commonly-owned co-pending application U.S. Pub. No. 2011/0254236, a wafer charging phenomena was detected whereby uncharged wafers became charged after having been loaded onto the chuck. The present inventors discovered that the cause of this unexpected wafer charging was a surface charge on the outer surface of the chuck cover, and that surface charge could be transferred to the wafer due to electrostatic induction, resulting in a very high wafer surface charge.

It is to be noted that the gripping pins such as those illustrated at 10-1 through 10-6 are typically not maintained in continuous contact with the wafer edge during processing. For example, it is conventional to briefly slacken the grip of the pins as the wafer as it is being rotated at high speed to cause relative rotation between the wafer and the gripping pins (so-called "wafer shift") and thereby to achieve more uniform processing results.

The charging of the wafer surface by electrostatic induction from the insulating cover was unexpected because those skilled in this art considered that electrostatic induction (separation of charges) occurred based on friction between two non-conductive materials. Friction between two non-conductive materials however would require the two materials to contact one another. As the chuck cover does not contact the wafer and thus creates no friction between itself and the cover, it was surprising to discover that the chuck cover could nonetheless charge the wafer surface by electrostatic induction, and indeed lead in some cases to a very high surface charge on the wafer.

To address this problem, the cover 30 or other outer chuck surface that faces the wafer W is made so as to include an electrically conductive material, and an electrically conductive pathway is provided leading from the electrically conductive material toward ground.

It will be appreciated that any relatively conductive plastic material having sufficiently electrically conductive properties may be used for that purpose. For example, suitable conductive plastic materials include polyvinylidene fluoride incorporating conductive carbon, such as that which is marketed under the trade name SIMONA PVDF-EL, and which is reported to exhibit volume and surface resistivities of $\leq 10^6$ ohm*cm and $\leq 10^6$ ohm, respectively, under test method DIN IEC 60093. Other relatively conductive plastics include carbon filled ethylene tetrafluoroethylene such as, for example, that marketed under the trade name Fluon LM-ETFE AH-3000, and carbon fiber filled perfluoroalkoxy such as, for example, that marketed by Dupont under the trade name VESPEL CR-6110, which comprises a composite of carbon fiber sheets and polymer layers and is believed to exhibit volume and surface resistivities of about $10^{-1}$ ohm*cm and $10^{-1}$ ohm, respectively, in the direction of the layers and about $10^0$ ohm*cm and $10^1$ ohm, respectively, normal to the layers.

Thus, referring again to FIG. 3, a first electrically conductive pathway is preferably provided extending from at least one and preferably each of the electrically conductive pin assemblies 10-1 through 10-6, via needle bearing 32, helical spring 34, spring seat 36, which is located below and in electrical contact with the helical spring 34, and radially extending conductive strip 38, which makes electrical contact with rotor 40, from whence the conductive pathway can be led to ground e.g. via suitable conductive brushes to the stator 42 and on to the frame 44.

In addition, a second electrically conductive pathway is provided extending from the chuck cover 30 (or a portion of that cover made of electrically conductive material) to the upper spring seat 37 mounted to an underside surface of cover 30, and continuing via the helical spring 39 and the lower spring seat 41 mounted to the conductive strip 38, from whence the second pathway is the same as described above for the first pathway. In FIGS. 2 and 3 it will moreover be noted that the springs 39 each pass through a respective opening formed in ring gear 16. Needless to say, each of the foregoing components involved in the first and second conductive pathways is itself electrically conductive either in whole or in part sufficient to establish the pathway in question.

The upper and lower spring seats 37 and 41 may if desired take the form of rings or plural segments of rings for example positioned coaxially with the rotation axis of the chuck, so as to accommodate a plurality of springs 39.

Thus, chuck 1 provides an electrically conductive pathway leading from the outer surface of the chuck that faces the underside of wafer W, for example the chuck cover 30, through the spring seat 37, spring 39, spring seat 41 and conductive strip 38, as well as optionally from one or more of the pin assemblies 10-1 through 10-6 through needle bearing 32, helical spring 34, spring seat 36 and conductive strip 38. Each of the above pathways may then be led for example to the chuck rotor, and then onward to an electrical ground, for example, by electrical connection to associated tool framing or another suitable ground.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for processing wafer-shaped articles, comprising a chuck adapted to hold a wafer-shaped article of a predetermined diameter during a processing operation to be performed on the wafer-shaped article, said chuck comprising a chuck body having an outer surface that faces a wafer-shaped article when positioned on the chuck, wherein said outer surface comprises a first electrically conductive material and wherein said chuck body further comprises a first conductive pathway for grounding said first conductive material.

2. The apparatus according to claim 1, wherein said chuck body comprises a chuck base body and a cover fitted to said chuck base body, and wherein said cover comprises said first electrically conductive material.

3. The apparatus according to claim 2, wherein said first conductive pathway comprises at least one conductive helical spring contacting at one end a conductive element mounted on said cover and contacting at another end a conductive element mounted on said chuck base body.

4. The apparatus according to claim 2, wherein said first conductive pathway comprises at least one conductive strip mounted on said chuck base body and extending from a peripheral region to a central region of said chuck base body.

5. The apparatus according to claim 2, wherein said first conductive pathway comprises a first annular conductive element mounted on an interior surface of said cover, a second annular conductive element mounted on an interior surface of said chuck base body, and a plurality of conductive helical springs, each of said plurality of conductive helical springs having a first end contacting said first annular conductive element and a second end contacting said second annular conductive element.

6. The apparatus according to claim 2, wherein said cover is joined to said chuck base body so as to form an internal gap therebetween, said first conductive pathway being provided within said internal gap.

7. The apparatus according to claim 1, further comprising a plurality of pin assemblies adapted and positioned relative to the chuck body so as to support a wafer-shaped article to be processed, wherein at least one of said pin assemblies comprises a second electrically conductive material.

8. The apparatus according to claim 7, further comprising a second conductive pathway extending from said at least one of said pin assemblies to ground.

9. The apparatus according to claim 7, wherein said second conductive pathway comprises an electrically conductive needle bearing contacting said at least one of said pin assemblies.

10. The apparatus according to claim 1, wherein the chuck is a spin chuck surrounded by a process chamber for single wafer wet processing of semiconductor wafers.

11. The apparatus according to claim 1, wherein said chuck is adapted to hold a wafer-shaped article such that the wafer-shaped article does not contact said outer surface of said chuck body.

12. The apparatus according to claim 1, wherein said conductive pathway leads to a frame on which said chuck is mounted.

13. The apparatus according to claim 1, further comprising a plurality of pin assemblies adapted and positioned relative to the chuck body so as to support a wafer-shaped article to be processed, and a ring gear in meshing engagement with each of said plurality of pin assemblies.

14. The apparatus according to claim 13, further comprising a stationary nozzle assembly protruding through a central portion of said chuck body, said stationary nozzle assembly being adapted to supply one or more treatment fluids to an underside of a wafer-shaped article when positioned on said chuck.

15. The apparatus according to claim 13, wherein each of said plurality of pin assemblies comprises a gripping pin positioned eccentrically to a pivotal axis of its respective pin assembly, whereby rotation of said ring gear causes each of said gripping pins to move simultaneously either toward or way from an axis of rotation of said chuck.

* * * * *